US006777971B2

(12) United States Patent
Kirloskar et al.

(10) Patent No.: US 6,777,971 B2
(45) Date of Patent: Aug. 17, 2004

(54) HIGH SPEED WAFER SORT AND FINAL TEST

(75) Inventors: Mohan Kirloskar, Cupertino, CA (US); Albert Alcorn, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/394,445

(22) Filed: Mar. 20, 2003

(65) Prior Publication Data

US 2003/0214317 A1 Nov. 20, 2003

Related U.S. Application Data

(60) Provisional application No. 60/366,338, filed on Mar. 20, 2002.

(51) Int. Cl.[7] .............................................. G01R 31/26
(52) U.S. Cl. ...................................................... 324/765
(58) Field of Search ................................ 324/763, 765, 324/73.1, 158.1; 438/14, 18; 257/40, 48; 714/718, 725, 733–734

(56) References Cited

U.S. PATENT DOCUMENTS

| | | | |
|---|---|---|---|
| 5,524,114 A | | 6/1996 | Peng |
| 5,570,035 A | * | 10/1996 | Dukes et al. ................ 324/763 |
| 5,994,912 A | * | 11/1999 | Whetsel ...................... 324/765 |
| 6,130,546 A | | 10/2000 | Azizi |
| 6,255,208 B1 | | 7/2001 | Bernier et al. |
| 6,343,369 B1 | | 1/2002 | Saunders et al. |
| 6,352,871 B1 | | 3/2002 | Goruganthu et al. |
| 6,400,173 B1 | | 6/2002 | Shimizu et al. |
| 6,456,099 B1 | * | 9/2002 | Eldridge et al. .......... 324/158.1 |
| 6,480,012 B1 | * | 11/2002 | Komori .................... 324/158.1 |
| 6,646,461 B2 | * | 11/2003 | Sugiura et al. ............. 324/765 |
| 6,717,430 B2 | * | 4/2004 | Burch ........................ 324/765 |
| 2001/0016929 A1 | * | 8/2001 | Bonneau et al. ............ 714/735 |
| 2002/0109514 A1 | | 8/2002 | Brandorff et al. |
| 2003/0093735 A1 | * | 5/2003 | Stong et al. ................ 714/733 |
| 2003/0221152 A1 | * | 11/2003 | Volkerink et al. ........... 714/736 |

* cited by examiner

Primary Examiner—David A. Zarneke
Assistant Examiner—Jermele Hollington
(74) Attorney, Agent, or Firm—Hamilton, Brook, Smith & Reynolds, P.C.

(57) ABSTRACT

A semiconductor device which receives and transmits data at high speed is tested at operational speed at wafer sort. A probe card includes a high-speed interconnect that couples probe output bonding pads to probe input bonding pads. The high-speed interconnect connects a respective output of a transmitter in the die to a respective input of a receiver in the die while the probe card is connected to the die. A built in self test circuit in the die generates test patterns and compares them for accuracy. The test patterns are routed on the high-speed interconnect from the output of the transmitter to the input of the receiver allowing the data path through the receiver and transmitter in the die to be tested at operational speed before the die is assembled into a package.

17 Claims, 7 Drawing Sheets

HIGH SPEED WAFER SORT AND FINAL TEST

RELATED APPLICATION

This application claims the benefit of U.S. Provisional Application No. 60/366,338, filed Mar. 20, 2002. The entire teachings of the above application are incorporated herein by reference.

BACKGROUND OF THE INVENTION

Integrated circuits are manufactured on a semiconductor wafer. Typically, hundreds of integrated circuits commonly referred to as dies are built on the same wafer. After wafer fabrication the wafer is cut into individual dies or chips. Each die is packaged by coupling bonding pads on the die to corresponding bonding pads on a substrate.

A substantial number of dies on the wafer may be defective. As each step of the semiconductor manufacturing process adds cost to the final product, it is beneficial to determine whether a particular die is operational at various steps of the manufacturing process. A wafer sort test is typically performed after wafer fabrication to determine faulty dies prior to cutting the wafer into individual dies. Typically, wafer sort tests include a functional test of the circuitry in the die.

The wafer sort test is performed by a tester coupled to a probe card. The tester generates test signals and transmits the test signals to dies on the wafer through the probe card which is coupled to the die to be tested. Each die on the wafer is tested by moving the wafer to couple the die to be tested to the probe card.

The probe card has a plurality of probe bonding pads corresponding to die bonding pads on the die. The wafer is moved toward the probe card until the probe bonding pads on the probe card are coupled to the die bonding pads on the die to be tested. Test results are transmitted from the die through the probe card to the tester to be analyzed by the tester.

Wafer sort tests typically include parametric tests and functional tests. A parametric test tests electrical characteristics (DC parameters) of the die. A functional test tests the operation of an electric circuit in the die. After a die is tested, the wafer is moved to position the next die to be tested under the probe card. FIG. 1 illustrates a prior art probe card 118 in a wafer sort testing system. A wafer 100 includes a plurality of dies 102 with each die having a plurality of die bonding pads 108. Each die 102 on the wafer is functionally tested by a tester 114 by coupling the die to a probe card 106 through probe needles 104. The probe card 106 includes a plurality of probe bonding pads 108 corresponding to the die bonding pads 108 on the die. The tester 114 supplies electrical signals to the die through the probe card 106 and measures other electrical signals on the die. The tester 114 performs a functional test of the substrate by supplying an electrical signal through test channel 116 to a test pad 112. Test pad 112 is coupled through trace 118 in the probe card 106 to one of the probe bonding pads 110 on probe card 106. The electrical signal is supplied to the die 102 through probe needle 104 and die bonding pad 108.

Typically, the operating speed of the tester is limited by frequency limitations due to the length of the probe needles 104 and cross-talk between the probe needles 104. Probe needle length is typically about 1". Wafer sort testers can operate up to 500 Mega Hertz (MHz) but typically operate at about 200 MHz because of these frequency limitations.

However, semiconductor devices such as networking devices with high-speed transmitters and receivers operate at frequencies greater than 500 MHz. For example, in a switch which transfers data according to the ANSI T1X1.5 standard, commonly referred to as Synchronous Optical NETworking (SONET), the serial data Input/Output transfer rate is 3.125 Giga bits per second (Gbps).

SUMMARY OF THE INVENTION

A built in self test circuit which generates test patterns and compares them for accuracy is included in a die. A probe card includes high-speed interconnects which connect a respective output of a transmitter in the die to a respective input of a receiver in the die while the probe card is connected to the die. The high-speed interconnect allows the data path through the receiver and transmitter in the die to be tested at operational speed before the die is assembled into a package.

A method and apparatus for performing a wafer sort test is presented. A wafer includes a plurality of dies. Each die includes a plurality of die bonding pads and a built in self test circuit. At least one die bonding pad is coupled to an input of a receiver and at least another die bonding pad is coupled to an output of a transmitter. The built in self test circuit generates test data to be transmitted through the transmitter and analyzes the test data received at the input of the receiver. A probe card includes a plurality of probe bonding pads for coupling to the plurality of die bonding pads on the die. When the die is coupled to the probe card, the probe bonding pads corresponding to the receiver input and the transmitter output are coupled to corresponding die bonding pads. An interconnect in the probe card connects probe bonding pads to route test data transmitted from the transmitter to the receiver.

The test data may be transmitted and received at an operational speed greater than 500 MHZ. The test data may be a pseudo random bit sequence.

The built in self test circuit may also include framing logic which generates framing characters. The framing characters precede the pseudo random bit sequence in a frame. The pseudo random bit sequence may be stored in a payload of the frame and the framing characters may be Synchronous Optical NETwork (SONET) framing characters or Ethernet idle characters.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 2:
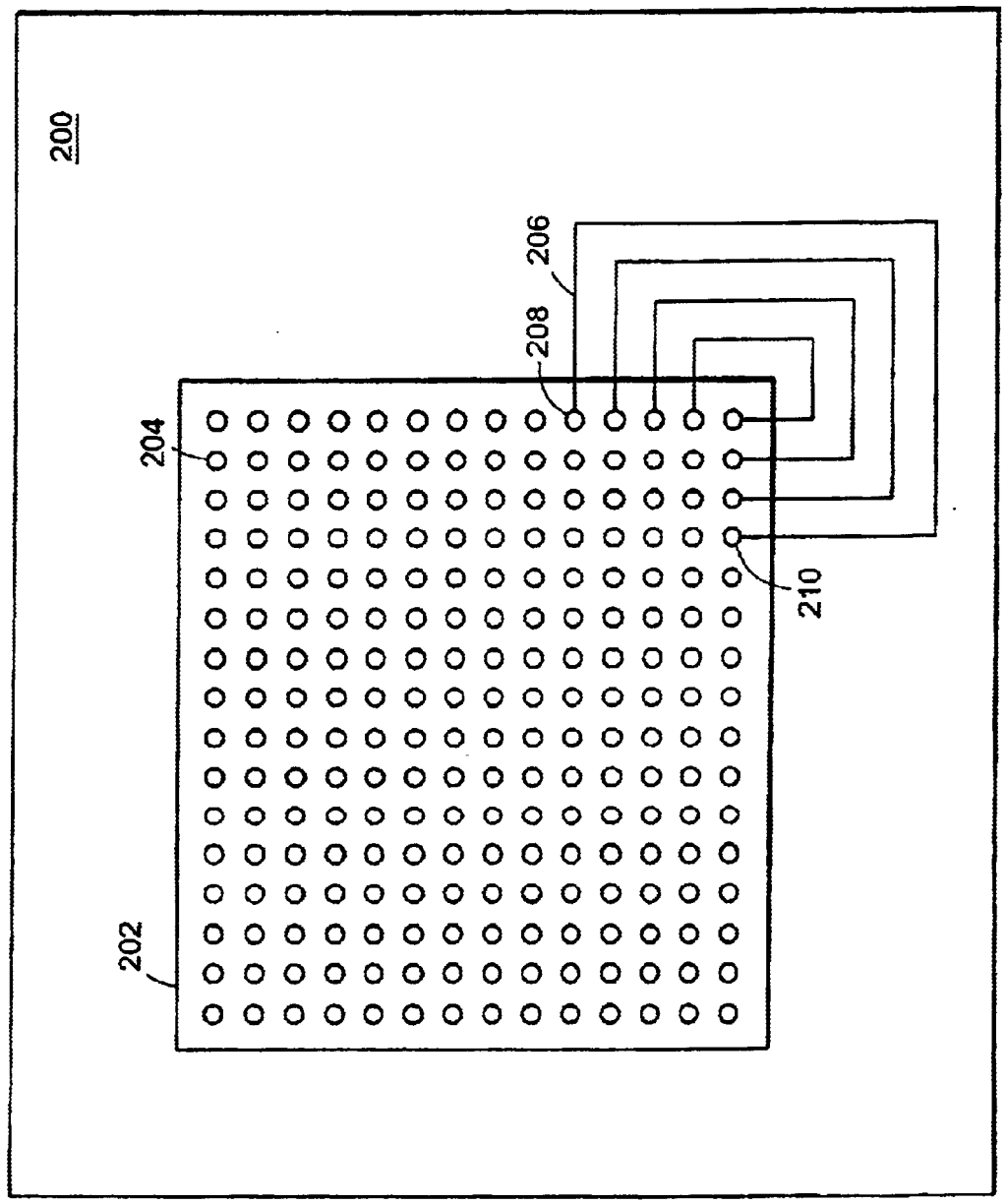
FIG. 2 illustrates a plan view of a test probe card including a high-speed interconnect for performing a wafer sort test at operational speed according to the principles of the present invention.

FIG. 2 illustrates a plan view of a test probe card 200 including a high-speed interconnect for performing a wafer sort test at operational speed according to the principles of the present invention. The test probe card 200 includes an array of probe bonding pads 204. The probe bonding pads 204 include an input probe bonding pad 208 and an output probe bonding pad 210. The input probe bonding pad 208 is connected to the output probe bonding pad 210 by a controlled impedance interconnect 206 to provide a high-speed interconnect when the probe is coupled to a die to be tested.

Figure 1:
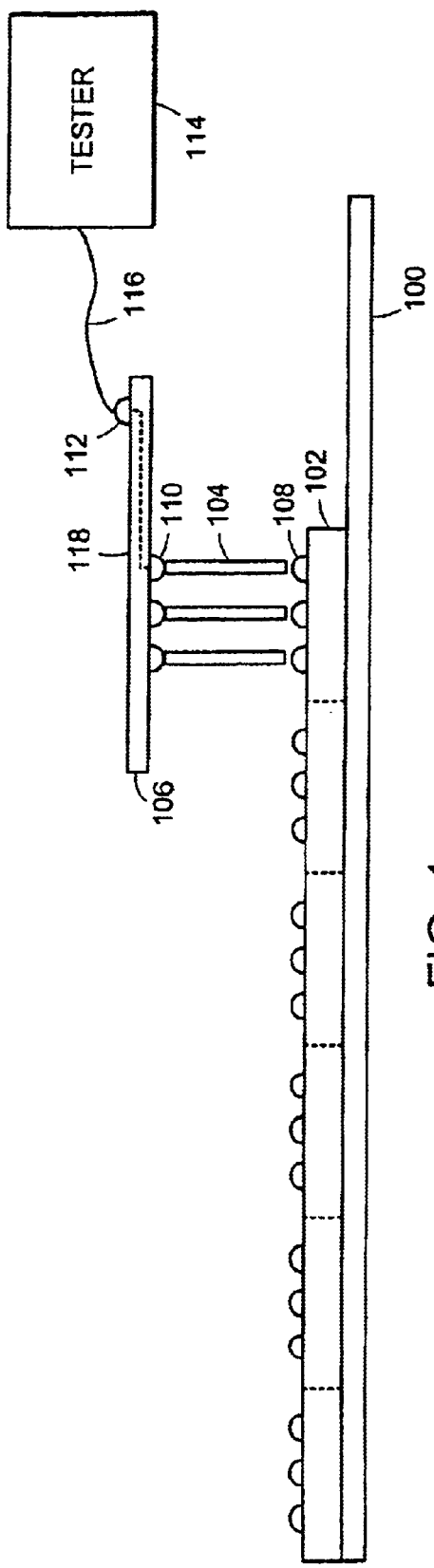
FIG. 1 illustrates a prior art probe card in a wafer sort testing system.

As discussed in conjunction with FIG. 1, each die on the wafer to be tested includes a plurality of die bonding pads 108 (FIG. 1). The test probe card 200 includes a probe bonding pad 204 corresponding to each die bonding pad 108 on the die.

The die bonding pads 108 (FIG. 1) on the upper surface of the die 102 (FIG. 1) are solder bumped. The solder bumped die bonding pads allow the die to be packaged by flipping the die and connecting the die bonding pads 108 (FIG. 1) directly to bonding pads on a package substrate. A die having solder bumped bonding pads on the upper surface of the die is commonly referred to as a flip-chip.

The probe card 200 is flip-chip style probe card having short probe tips to minimize cross-talk. The test probe card 200 includes probes coupled to each bonding pad 204 for coupling to corresponding die bonding pads on the die to be tested. The length of each probe is less than about 0.1 inch to minimize signal distortion due to cross-talk between adjacent probes. The die is tested by connecting the probe card 200 to the die 102 such that the die bonding pads 108 on the upper surface of the die are connected to the corresponding probe bonding pads 204. The input probe bonding pad 210 corresponds to a die bonding pad coupled to the input of a receiver in the die. The output probe bonding pad 208 corresponds to a die bonding pad coupled to the output of a transmitter in the die.

Figure 3:
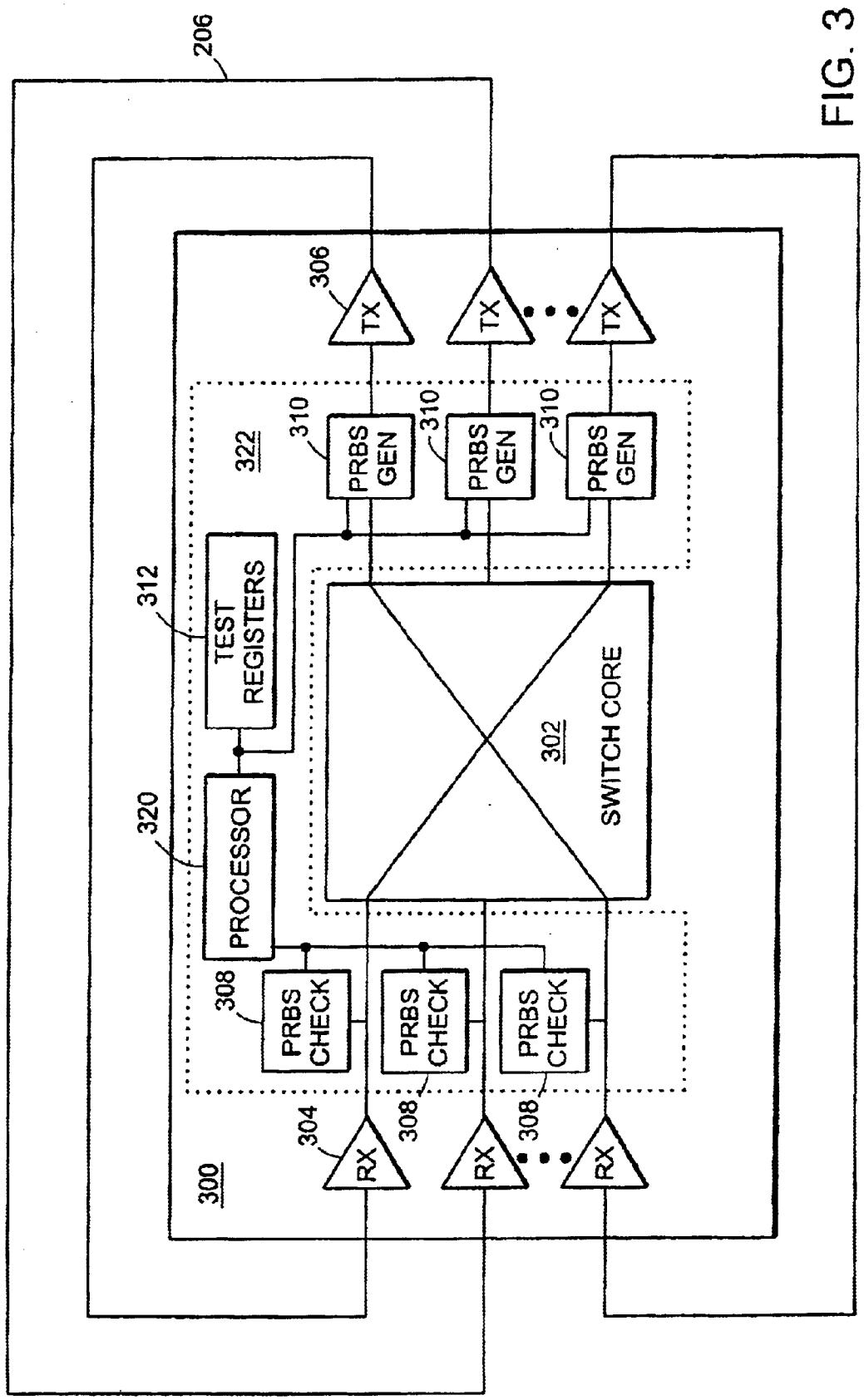
FIG. 3 is a block diagram of logic included in a die that is coupled to the probe card of FIG. 2.

FIG. 3 is a block diagram of logic included in a die 300 that is coupled to the probe card 200 of FIG. 2. The die 300 includes a switch core 302, a plurality of receivers 304 and a plurality of transmitters 306. In one embodiment, the die is a Velio VC3003 140×140 3.125 Gbps Cross Point Switch which is packaged in a 1296 pin flip-chip Ball Grid Array (BGA) after it has been cut from the wafer.

In order to test the die 300, the test probe card 200 (FIG. 2) is coupled to the die 300 as described in conjunction with FIG. 1 for the prior art probe card 106. With the die 300 coupled to the test probe card 200, the interconnect 206 couples an input probe bonding pad 210 on the probe card 200 to the input of a receiver 304 in the die and an output probe bonding pad 208 to the output of a transmitter on the die. Thus, the outputs of transmitters 306 are coupled to the inputs of receivers 304 through controlled impedance interconnect 206 in the probe card 200 while the probe bonding pads are coupled to the respective die bonding pads. The controlled impedance interconnect 206 provides a high-speed interconnect connecting the serial data outputs of each high speed transmitter in the die to the high-speed receivers on the die. The controlled impedance interconnect 206 is a very high quality transmission line that allows a 3.125 Gigabit per second (Gbps) signals to pass from transmitter output to receiver input with very little signal degradation.

Returning to FIG. 2, the other bonding pads 204 (FIG. 1) on the probe card are coupled to power, clock and control signals in the die to be tested. These signals operate at lower speeds than the high-speed data signals and thus can be coupled directly to the tester 114 as described in conjunction with FIG. 1. Only high speed signals, for example, data signals from transmitters on the die, are routed through the probe card 200 through the controlled impedance interconnect 206.

The die includes a Built-in Self-Test circuit 322 which generates test data and tests the received test data. The Built in Self Test circuit includes test registers 312, a processor 320 pseudo random bit sequence (PRBS) checkers 310 and pseudo random bit sequence (PRBS) generators 308. A request to start the Built-in Self-Test is issued by the tester 114 (FIG. 1) to the die 102 to be tested. Typically, the request is issued by writing a command to start the Built-in Self-Test to one of the test registers 312 in the die. The processor 320 reads the test register 312 and initiates the requested test by configuring the PRBS generators/checkers. The results of the Built-in Self-Test can be retrieved from the die by reading another one of the test registers 312 storing the results of the Built-in Self-Test. In the embodiment shown, the probe card 200 is coupled to one die on the wafer at a time. However, in an alternative embodiment, a probe card 200 may include a plurality of arrays of probe bonding pads 202 allowing a plurality of dies on the wafer to be tested in parallel.

The Built-in Self-Test Circuit 322 generates a Pseudo Random Bit Sequence (PRBS) to test the data I/O path through the transmitters and receivers at operational speed. There is a PRBS checker/generator 308, 310 coupled to each receiver 304 and transmitter 306. In the embodiment shown, the Pseudo Random Bit Sequence (PRBS) generator 308 coupled to each receiver 304 is configured as a checker and a Pseudo Random Bit Sequence (PRBS) checker 310 coupled to each transmitter 306 is configured as a generator. In one embodiment, data is transmitted and received over the controlled impedance interconnect 206 in the probe card 200 at 3.125 Gbs.

A pseudo random bit sequence generator produces an n-bit PRBS pattern dependent on a selected polynomial. The pattern is a repeating string which includes all possible n-bit patterns excluding all zeros. PRBS pattern types are represented by polynomials defined by International Telecommunications Union ("ITU") standards, for example, ITU-O.151 and ITU-O.152. Two commonly used PRBS pattern types are represented by PRBS-23: $2^{\wedge}23=X^{\wedge}23+X^{\wedge}18+1$ and PRBS-31: $2^{\wedge}31=X^{\wedge}31+X^{\wedge}28+1$. The sequence is typically generated through the use of a shift register and feedback paths from two or more stages of the shift register. For example, the PRBS-23 sequence can be generated by a 23-stage serial shift register with stage 23 and 18 outputs fed back through an exclusive-OR gate to the input of stage 1.

The Built in Self Test circuit uses the PRBS sequence to test the I/O data path through the die from the inputs of the receivers 304 to the outputs of the transmitters 306. The data is looped back from the output of the transmitters 306 to the input of the receivers 304 through the interconnect 206. The PRBS generators 310 and checkers 308 in conjunction with the interconnect 206 in the probe card 200 allows the receivers and transmitters 306 in the die to be tested at operational speed before the die is cut from the wafer. This allows the device to be tested in an environment that is more stringent than customer applications before the device is assembled into a package.

The PRBS checkers 308 and generators 310 in the Built in self test circuit 322 can also be used to perform output amplitude tests and eye width degradation tests. The output amplitude test lowers the amplitude of each transmitter output until the PRBS sequence test fails. The eye width degradation is tested by using the PRBS sequence to create an eye mask and examining the jitter of a signal, that is, the delay between an expected transition and an actual transition. Another of the built in self tests utilizes one of the PRBS generator/checkers coupled to one of the receivers 308 to generate the PRBS data. The PRBS data is broadcast throughout the entire device and output by every transmitter 306. After using the same interconnect connection, the PRBS sequence is presented at the receiver of all of the other channels and checked there. This test is repeated from every receiver so that each receiver is tested in the master operation.

There are portions of the circuitry on the die that cannot be verified by only transmitting and receiving the PRBS sequence. More complete tests have previously been made at operational speed after the die has been packaged through the use of externally generated SONET frames. However, externally generated SONET frames are not suitable for testing dies on a wafer due to the same frequency limitations discussed above. In order to test the control circuitry at operational speed at wafer sort, the PRBS generator generates framed PRBS by storing the PRBS sequence in the payload of a SONET frame preceded by SONET framing characters.

Figure 4A:
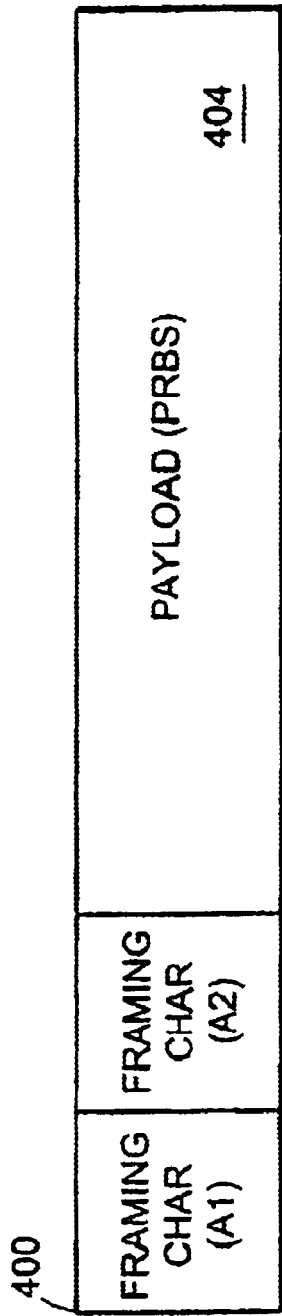
FIG. 4A illustrates framed PRBS for testing SONET control circuits.

FIG. 4A illustrates framed PRBS for testing SONET control circuits. To test a device implementing the SONET protocol, the PRBS data is "framed" so that in addition to the PRBS sequence, control characters are also present in the data stream. This allows verification of the portions of the device that perform special functions when these control characters are detected. The PRBS data is stored in the payload 404 of the SONET frame 400. The payload 404 of a SONET frame is preceded by two framing octets, A1 402 and A2. According to the SONET standard, the bit pattern in the A1 octets is 1111 1110 (0xf6) and the A2 octet is 0010 1000 (0x28). The receiver searches for this bit pattern in order to synchronize to the received data. The PBRS generator in the Built in Self Test circuit 322 generates the framing octets so that the control circuitry in the receiver can be tested at operational speed.

Figure 4B:
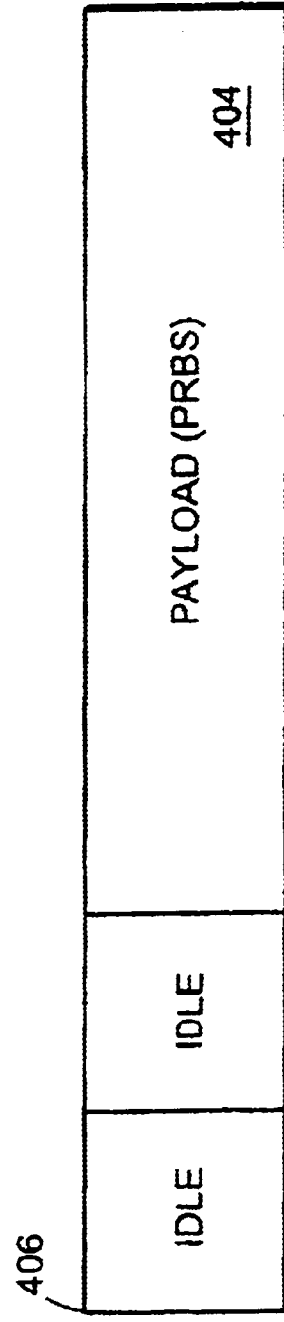
FIG. 4B illustrates framed PRBS for testing Gigabit Ethernet control circuits.

FIG. 4B illustrates framed PRBS for testing Gigabit Ethernet control circuits. The high speed interconnect has been described for testing a network device using the SONET protocol but the invention is not limited to devices using the SONET protocol. The probe card with data Input/Output (I/O) loopback can also be used to test data paths on dies at operational speed for other network protocols such as, Gigabit Ethernet and Fibre Channel High Speed Interface (FC-HSPI).

In this case, the PRBS generator provides a data stream that resembles a Gigabit Ethernet (GE) or Fibre Channel (FC) packet. The stream includes a header 408 preceding a payload. The header includes an idle character defined by the GE and FC protocol. The idle character is repeated a user chosen number of times. In the embodiment shown, two idle characters 408 precede the PRBS Sequence. The idle characters allow the receiver to synchronize with the received data stream prior to receiving the payload. The receiver searches for the idle characters in order to synchronize to the received data. The payload 404 includes PRBS sequence that has been passed through an 8b/10b encoder.

The high-speed interconnects have been described for high speed serial data I/O. The high-speed interconnects 206 on the probe card can be used to test any data path in a die prior to packaging. In an alternative embodiment, the high-speed interconnects can be used to test a parallel data path.

The generation and checking of framed PRBS sequences allows all of the high-speed logic in the data I/O path to be tested at operational speed before the die is packaged. Each die which passes the wafer sort test, is packaged after it has been cut from the wafer. The packaging step couples a package substrate to the flipped die. The package substrate has bonding pads in the same position as the probe bonding pads in the test probe card but does not include the interconnects 206. The package substrate for a BGA package also includes pads for coupling the packaged die to a Printed Circuit Board (PCB). After the die is packaged, the Built-in-Self-Test included in the die can be used to perform further testing of the packaged die.

Figure 5:
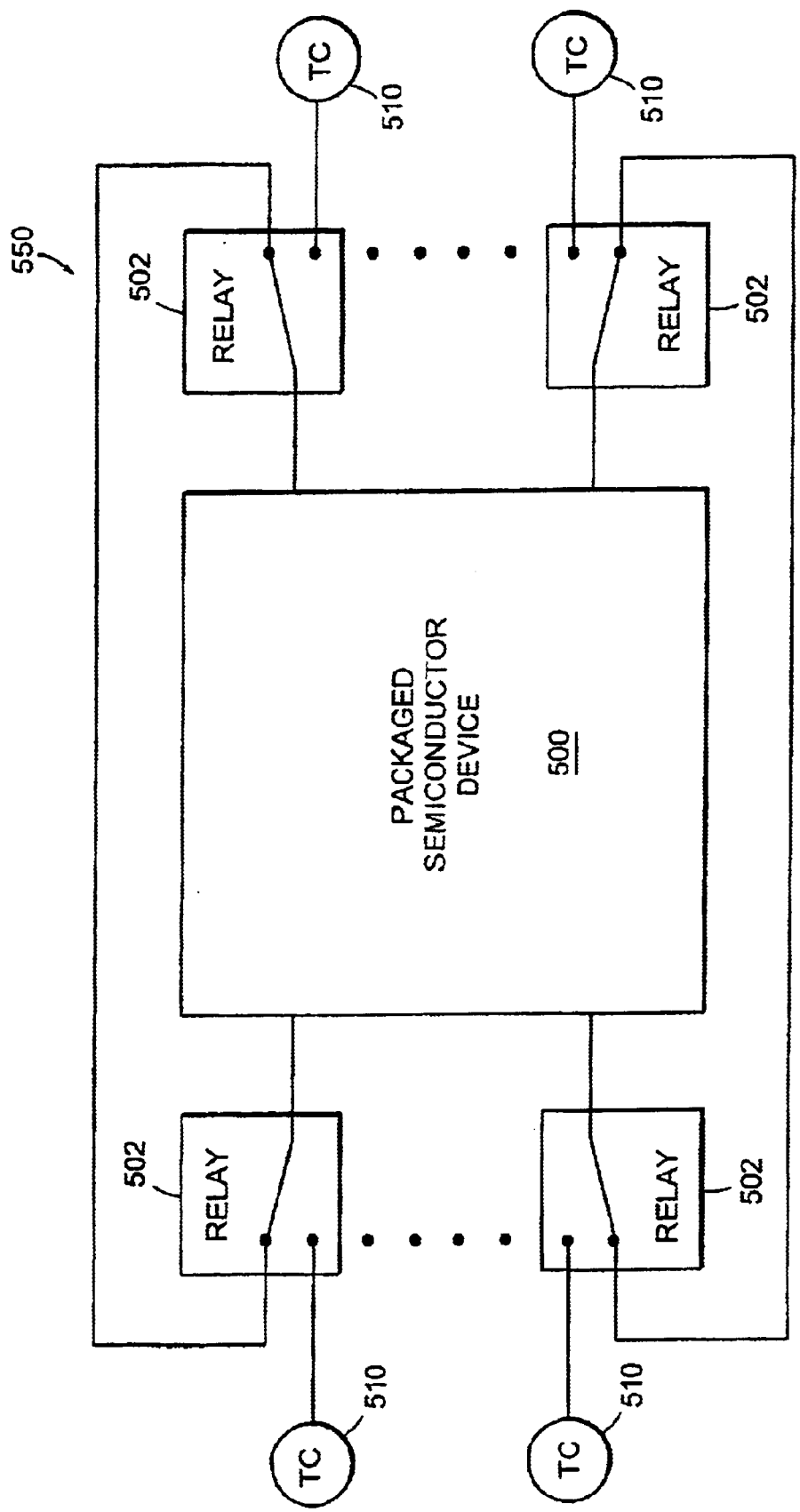
FIG. 5 is a block diagram of a test card for testing the packaged die at operational speed.

FIG. 5 is a block diagram of a test card (Printed Circuit Board) 550 for testing the packaged die at operational speed. The packaged die 500 is inserted into a socket on the test card 550. In one embodiment for testing a BGA packaged die, the socket is a Bantam-Pak Contactor for BGA manufactured by Everett Charles Technologies. A tester is coupled to the test card 550 to test continuity, leakage and impedance of the packaged die, by applying test signals through Test Channels (TC) 510 coupled to BGA pads on the packaged die. The Test Channels 510 are typically coupled to the test card 550 through contact pins connected to the board. After, the traditional tests have been successfully performed, more stringent functional tests can be performed using the built in self test circuit included in the packaged die. Each input and output in the packaged die is coupled to a respective high-speed relay 502. In one embodiment the high-speed relay is the RF103 manufactured by Teledyne. The relays 502 allow data loopback testing at operational speed to be performed by the built in self-test circuit included in the packaged die.

Test signals transmitted by Automatic Test Equipment (ATE) through Test Channels (TC) 510 are coupled to inputs of the packaged die through the high-speed relays 502, to allow the ATE to test the packaged die 500. Relays 502 coupled between the Test Channel 510 and the pins of the packaged die allow test results to be transmitted to the ATE. A functional loopback test is performed by connecting input pins to output pins through the relays 502.

Figure 6:
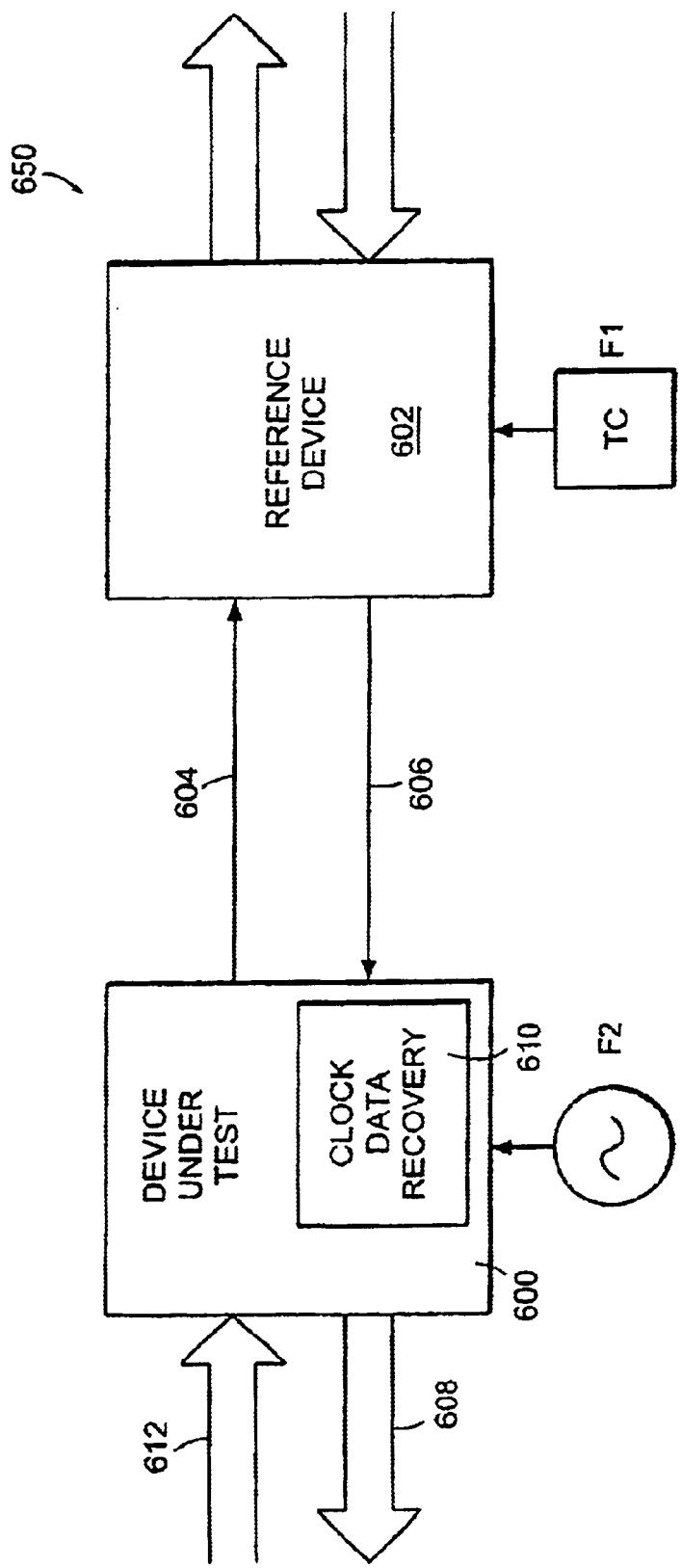
FIG. 6 illustrates two packaged dies operating from independent clocks for testing plesiochronous mode.

FIG. 6 illustrates two packaged dies 600, 602 operating from independent clocks (f1, f2) in plesiochronous mode. Instead of looping the outputs of one device back to the inputs of the same device, the outputs from one packaged die 600 are connected directly to the inputs of another packaged die 602. This configuration allows the packaged die to be tested in plesiochronous mode using the Built-In Self-Test Circuit in the die. The device under test 600 is operated at clock frequency f2 and the reference device 602 is operated at frequency f1. There is a small difference in frequency between f1 and f2 allowing plesiochronous mode to be tested.

Plesiochronous mode tests the operation of the device with a small frequency difference between a receive clock and a transmit clock and a slow varying phase difference between the clocks. In the embodiment shown, the Device Under Test (DUT) 600 is a Serializer/Deserializer. Parallel data received on the parallel inputs 612 is converted to serial data which is transmitted based on transmit clock f2 on a serial link 604 to a reference device 602. Serial data received on serial link 606 from the reference device 602 based on receive clock f1 is output on parallel outputs 608. The receive path includes Clock and Data Recovery (CDR) 610 for extracting the serial data received on the serial link 606.

Figure 7:
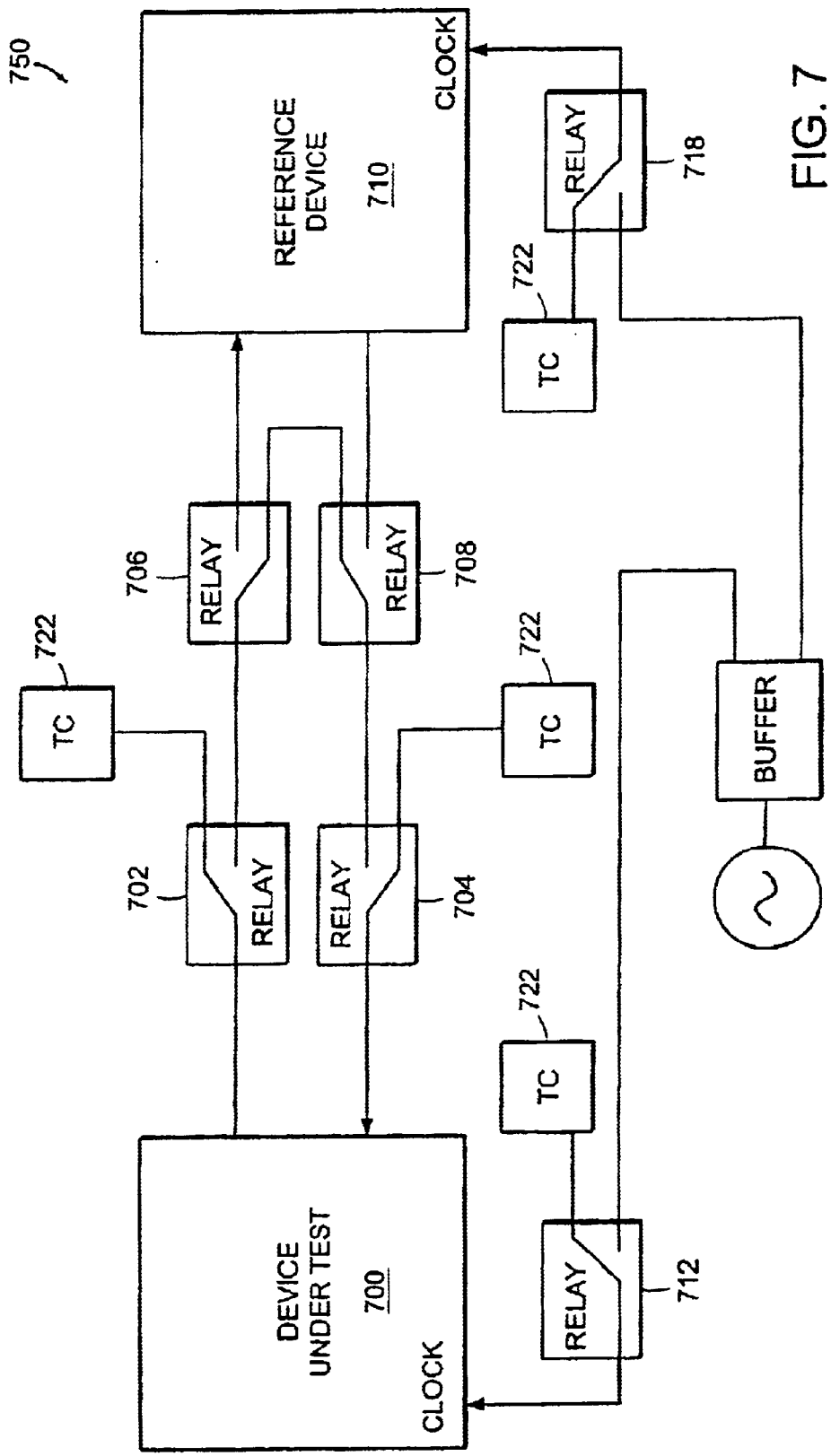
FIG. 7 is a block diagram of a silicon evaluation board which is designed for testing a single semiconductor device.

FIG. 7 is a block diagram of a silicon evaluation board 750 for testing a single semiconductor device (packaged die). In one embodiment, the device is a Serializer/Deserializer (SerDes) that converts parallel data to serial data and serial data to parallel data with the serial link operating at 3.125 Gbps. The device is packaged in a Ball Grid Array (BGA) package. The evaluation board 750 includes a socket in which the semiconductor device to be tested (device under test 700) is inserted. In one embodiment the socket is a Bantam socket manufactured by Everett Charles Technology which minimizes signal distortion. The Automatic test equipment load board 720 allows for high-speed loopback connection of I/O data signals. Additional high frequency relays 712, 718 are added to the loop back path so that Automatic test equipment can connect to the high-speed receivers and transmitters to allow the device to operate in a plesiochronous mode. The evaluation board 720 allows the Device Under Test (DUT) 700 to be tested by Automatic Test Equipment (ATE) through the tester channels 722 of the ATE coupled to the relays 712, 718. The automatic test equipment load board also allows functional testing of the Device Under Test 700 using the built in self test circuit in the packaged die by providing a serial loopback through relays 702, 704, 706, 708. The evaluation board 750 can also be used to test plesiochronous mode by providing clocks of different frequencies to the clock inputs of the Device Under Test 700 and the reference device 710 through relays 712, 718 and coupling the outputs of the DUT 700 to the inputs of reference device 710 through relays 702, 706 and the outputs of reference device 710 to the inputs of DUT 700 through relays 708, 704.

Thus, the relays on the evaluation board 750 allow functional loopback testing at operational speed, traditional ATE tests through tester channels and plesiochronous mode tests to be performed on the DUT.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for performing a wafer sort test comprising:
   (a) a wafer comprising a plurality of dies, each die comprising:
      a plurality of die bonding pads, at least one die bonding pad coupled to an input of a receiver input and another die bonding pad coupled to an output of a transmitter;
      a built in self test circuit which generates test data to be transmitted through the transmitter and analyzes the test data received at the input of the receiver; and
   (b) a probe card comprising a plurality of probe bonding pads for coupling to the plurality of die bonding pads, the probe bonding pads coupled to the die bonding pads, an interconnect in the probe card connecting probe bonding pads to route test data transmitted on the output of the transmitter in the die to the input of the receiver in the die.

2. The apparatus of claim 1 wherein the test data is transmitted and received at operational speed.

3. The apparatus of claim 2 wherein the operational speed is greater than 500 MHZ.

4. The apparatus of claim 2 wherein the test data is a pseudo random bit sequence.

5. The apparatus of claim 4 wherein the built in self test circuit further comprises:
   framing logic which generates framing characters, the framing characters preceding the pseudo random bit sequence in a frame.

6. The apparatus of claim 5 wherein the pseudo random bit sequence is stored in a payload of the frame.

7. The apparatus of claim 6 wherein the framing characters include Synchronous Optical NETwork framing characters.

8. The apparatus of claim 6 wherein the framing characters include Ethernet idle characters.

9. A method of performing a wafer sort test on a wafer including a plurality of dies comprising:
   coupling at least one die bonding pad on a die to an input of a receiver input in the die and another die bonding pad to an output of a transmitter in the die;
   in a probe card, coupling probe bonding pads connected to the receiver input and the transmitter output; and
   coupling the probe card to the die to connect probe bonding pads to corresponding die bonding pads;
   generating test data in the die, the test data transmitted through the transmitter and routed through an interconnect in the probe card to the input of the receiver; and
   analyzing the test data received at the input of the receiver.

10. The method of claim 9 wherein the test data is transmitted and received at operational speed.

11. The method of claim 10 wherein the operational speed is greater than 500 MHZ.

12. The method of claim 10 wherein the test data is a pseudo random bit sequence.

13. The method of claim 12 wherein further comprising:
    generating framing characters, the framing characters preceding the pseudo random bit sequence in a frame.

14. The method of claim 13 wherein the pseudo random bit sequence is stored in a payload of the frame.

15. The method of claim 14 wherein the framing characters include Synchronous Optical NETwork framing characters.

16. The method of claim 14 wherein the framing characters include Ethernet idle characters.

17. An apparatus for performing a wafer sort test on a wafer including a plurality of dies comprising:
    means for coupling at least one die bonding pad on a die to an input of a receiver input in the die and another die bonding pad to an output of a transmitter in the die;
    in a probe card, means for coupling probe bonding pads connected to the receiver input and the transmitter output; and
    means for coupling the probe card to, the die to connect probe bonding pads to corresponding die bonding pads
    means for generating test data in the die, the test data transmitted through the transmitter and routed through an interconnect in the probe card to the input of the receiver; and
    means for analyzing the test data received at the input of the receiver.

* * * * *